United States Patent
Lin

(10) Patent No.: US 9,831,155 B2
(45) Date of Patent: Nov. 28, 2017

(54) CHIP PACKAGE HAVING TILTED THROUGH SILICON VIA

(71) Applicant: NANYA TECHNOLOGY CORPORATION, Taoyuan (TW)

(72) Inventor: Po Chun Lin, Changhua County (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 15/068,206

(22) Filed: Mar. 11, 2016

(65) Prior Publication Data
US 2017/0263536 A1    Sep. 14, 2017

(51) Int. Cl.
*H01L 23/48*    (2006.01)
*H01L 21/768*    (2006.01)
(Continued)

(52) U.S. Cl.
CPC ...... *H01L 23/481* (2013.01); *H01L 21/76816* (2013.01); *H01L 21/76897* (2013.01);
(Continued)

(58) Field of Classification Search
CPC ......... H01L 21/76816; H01L 21/76897; H01L 21/76898; H01L 2225/06544; H01L 23/481; H01L 23/49827; H01L 25/657
See application file for complete search history.

(56) References Cited

U.S. PATENT DOCUMENTS

| 4,955,523 A | * | 9/1990 | Carlommagno | ........ H01L 24/11 219/56.21 |
| 4,998,885 A | * | 3/1991 | Beaman | ............ H01L 23/5385 257/E23.172 |

(Continued)

FOREIGN PATENT DOCUMENTS

KR    10-2011-0037062    4/2011

OTHER PUBLICATIONS

Office action and search report dated Dec. 30, 2016 from the Taiwan Intellectual Property Office for Taiwan application 105111193.
(Continued)

*Primary Examiner* — Earl Taylor
(74) *Attorney, Agent, or Firm* — Muncy, Geissler, Olds & Lowe, P.C.

(57) ABSTRACT

A chip package includes at least one integrated circuit die. The integrated circuit die includes a substrate portion having an internal plane between a front side and a back side, an electrical interconnect portion on the front side, a plurality of first connection terminals on an upper surface of the electrical interconnect portion, a plurality of second connection terminals on the back side of the substrate portion, a plurality of connection wirings electrically connecting the first connection terminals and the second connection terminals, a chip selection terminal between the internal plane of the substrate portion and the upper surface of the electrical interconnect portion, and a chip selection wiring connected to the chip selection terminal and one of the second connection terminals and the first connection terminals. At least one of the chip selection wiring and the plurality of connection wirings includes a tilted portion with respect to the back side of the substrate portion.

18 Claims, 11 Drawing Sheets

(51) Int. Cl.
*H01L 25/065* (2006.01)
*H01L 23/498* (2006.01)

(52) U.S. Cl.
CPC .. *H01L 21/76898* (2013.01); *H01L 23/49827* (2013.01); *H01L 25/0657* (2013.01); *H01L 2225/06544* (2013.01); *H01L 2225/06548* (2013.01)

(56) References Cited

U.S. PATENT DOCUMENTS

| | | | | |
|---|---|---|---|---|
| 5,371,654 A * | 12/1994 | Beaman | G01R 1/07307 | 174/16.3 |
| 5,585,675 A * | 12/1996 | Knopf | H01L 23/481 | 257/686 |
| 5,726,493 A * | 3/1998 | Yamashita | H01L 23/3128 | 257/686 |
| 5,994,152 A * | 11/1999 | Khandros | H01L 21/44 | 438/117 |
| 6,206,273 B1 * | 3/2001 | Beaman | G01R 1/0675 | 219/106 |
| 6,271,587 B1 * | 8/2001 | Patti | G11O 5/02 | 257/685 |
| 6,295,729 B1 * | 10/2001 | Beaman | B23K 20/004 | 228/180.5 |
| 6,448,661 B1 | 9/2002 | Kim et al. | | |
| 6,476,503 B1 * | 11/2002 | Imamura | H01L 21/561 | 257/737 |
| 6,526,655 B2 * | 3/2003 | Beaman | B23K 20/004 | 228/180.5 |
| 6,708,403 B2 * | 3/2004 | Beaman | B23K 20/004 | 228/180.5 |
| 7,242,081 B1 * | 7/2007 | Lee | H01L 25/0657 | 257/686 |
| 7,346,051 B2 * | 3/2008 | Nakayama | G06F 13/409 | 340/3.53 |
| 7,371,676 B2 * | 5/2008 | Hembree | B23K 20/004 | 228/180.5 |
| 7,390,740 B2 * | 6/2008 | Wark | H01L 21/486 | 257/E21.597 |
| 7,446,420 B1 | 11/2008 | Kim | | |
| 7,495,342 B2 * | 2/2009 | Beaman | B23K 20/004 | 257/784 |
| 7,550,836 B2 * | 6/2009 | Chou | H01L 23/3128 | 257/686 |
| 7,795,717 B2 * | 9/2010 | Goller | H01L 23/5389 | 257/685 |
| 7,855,462 B2 * | 12/2010 | Boon | H01L 21/4853 | 257/784 |
| 7,892,889 B2 * | 2/2011 | Howard | H01L 23/3121 | 257/E23.001 |
| 7,928,579 B2 * | 4/2011 | Wark | H01L 21/486 | 257/686 |
| 8,030,739 B2 | 10/2011 | Chung | | |
| 8,217,502 B2 * | 7/2012 | Ko | H01L 23/49827 | 257/686 |
| 8,243,485 B2 | 8/2012 | Jin et al. | | |
| 8,304,900 B2 * | 11/2012 | Jang | H01L 23/3128 | 257/733 |
| 8,334,599 B2 * | 12/2012 | Bruennert | H01L 23/481 | 257/686 |
| 8,372,741 B1 * | 2/2013 | Co | H01L 24/03 | 219/56.22 |
| 8,698,321 B2 | 4/2014 | Suh | | |
| 8,749,072 B2 * | 6/2014 | Zhao | H01L 25/0657 | 257/686 |
| 8,772,152 B2 * | 7/2014 | Co | H01L 24/03 | 219/56.22 |
| 9,082,753 B2 * | 7/2015 | Haba | B23K 20/007 | |
| 9,087,815 B2 * | 7/2015 | Haba | H01L 24/85 | |
| 9,349,706 B2 * | 5/2016 | Co | H01L 23/5389 | |
| 2002/0117330 A1 * | 8/2002 | Eldridge | B23K 20/004 | 174/260 |
| 2003/0048108 A1 * | 3/2003 | Beaman | B23K 20/004 | 324/755.11 |
| 2003/0106213 A1 * | 6/2003 | Beaman | B23K 20/004 | 29/860 |
| 2004/0148773 A1 * | 8/2004 | Beaman | B23K 20/004 | 29/868 |
| 2005/0062492 A1 * | 3/2005 | Beaman | G01R 3/00 | 324/754.07 |
| 2005/0082664 A1 | 4/2005 | Funaba et al. | | |
| 2005/0095835 A1 * | 5/2005 | Humpston | B81C 1/00293 | 438/613 |
| 2005/0289269 A1 * | 12/2005 | Nakayama | G06F 13/409 | 710/110 |
| 2006/0046475 A1 * | 3/2006 | Wark | H01L 21/486 | 438/667 |
| 2007/0045857 A1 * | 3/2007 | Wark | H01L 21/486 | 257/773 |
| 2007/0222054 A1 * | 9/2007 | Hembree | B23K 20/004 | 257/686 |
| 2007/0235851 A1 * | 10/2007 | Ware | H01L 25/0657 | 257/678 |
| 2008/0047741 A1 * | 2/2008 | Beaman | G01R 1/07307 | 174/256 |
| 2008/0048690 A1 * | 2/2008 | Beaman | G01R 1/07307 | 324/755.01 |
| 2008/0048691 A1 * | 2/2008 | Beaman | G01R 1/07307 | 324/756.04 |
| 2008/0054474 A1 | 3/2008 | Park | | |
| 2008/0116912 A1 * | 5/2008 | Beaman | G01R 3/00 | 324/755.05 |
| 2008/0116916 A1 * | 5/2008 | Beaman | G01R 3/00 | 324/750.05 |
| 2008/0132094 A1 * | 6/2008 | Beaman | G01R 3/00 | 439/69 |
| 2008/0237891 A1 * | 10/2008 | Irsigler | H01L 25/0657 | 257/778 |
| 2009/0014891 A1 * | 1/2009 | Chang | H01L 21/6835 | 257/777 |
| 2009/0026609 A1 * | 1/2009 | Masuda | H01L 23/49517 | 257/737 |
| 2009/0032966 A1 * | 2/2009 | Lee | H01L 21/76898 | 257/774 |
| 2009/0085205 A1 * | 4/2009 | Sugizaki | B81B 7/007 | 257/737 |
| 2009/0189288 A1 * | 7/2009 | Beaman | B23K 20/004 | 257/773 |
| 2009/0236700 A1 * | 9/2009 | Moriya | H01L 23/29 | 257/659 |
| 2009/0267194 A1 * | 10/2009 | Chen | H01L 21/76898 | 257/621 |
| 2009/0321953 A1 * | 12/2009 | Kang | H01L 23/3114 | 257/777 |
| 2010/0044877 A1 * | 2/2010 | Bruennert | H01L 23/481 | 257/777 |
| 2011/0068453 A1 * | 3/2011 | Cho | H01L 21/565 | 257/686 |
| 2012/0068351 A1 | 3/2012 | Oganesian et al. | | |
| 2012/0292759 A1 * | 11/2012 | Ishikawa | H01L 22/34 | 257/737 |
| 2013/0169343 A1 * | 7/2013 | Gillingham | G11O 5/02 | 327/365 |
| 2013/0214389 A1 * | 8/2013 | Lee | G11C 29/702 | 257/621 |
| 2014/0151901 A1 * | 6/2014 | Iwatsu | H01L 27/0688 | 257/774 |
| 2014/0191234 A1 * | 7/2014 | Huang | H01L 22/32 | 257/48 |
| 2014/0299980 A1 | 10/2014 | Choi et al. | | |
| 2014/0313845 A1 | 10/2014 | Ko | | |
| 2015/0064899 A1 | 3/2015 | Ji et al. | | |
| 2015/0084205 A1 * | 3/2015 | Lin | H01L 23/5384 | 257/774 |
| 2015/0200163 A1 * | 7/2015 | Lin | H01L 23/5384 | 257/621 |

(56) References Cited

U.S. PATENT DOCUMENTS

2016/0155724 A1* 6/2016 Kim .................... H01L 25/0657
257/48

OTHER PUBLICATIONS

English abstract translation of TW office action for application 105111193.
English abstract translation of KR 10-2011-0037062.

* cited by examiner

CHIP PACKAGE HAVING TILTED THROUGH SILICON VIA

TECHNICAL FIELD

The present invention relates to a chip package including at least one integrated circuit die having a tilted through silicon via.

DISCUSSION OF THE BACKGROUND

Chip stacking technology can bring two chips close together, thereby enabling faster data transmission between the two chips and consuming less power. Memory chips can be stacked together to obtain a memory module with a large storage capacity. In addition to stacking two of the same chip, two chips with different functions may also be stacked together to combine different functions.

In a memory chip stack, each memory chip has a chip selection (CS) terminal, which is used to enable the memory chip. For example, a DRAM chip can have a row address strobe (RAS), column address strobe (CAS), or chip selection pin (CSP) as a chip selection terminal. When a signal is applied to the chip selection terminal of a chip in a memory chip stack, the chip can be accessed, while other chips cannot.

Conventionally, signals applied to the chip selection terminals of the memory chip stack will flow through wires. Such wires need additional processes to form, which increases risk of signal trace shortage when going to fine-pitch products. Moreover, long wires cause signal delays by occupying more space, and results in a large chip package.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides a chip package comprising at least one integrated circuit die. In some embodiments, the at least one integrated circuit die comprises a substrate portion having an internal plane between a front side and a back side; an electrical interconnect portion on the front side; a plurality of first connection terminals on an upper surface of the electrical interconnect portion; a plurality of second connection terminals on the back side of the substrate portion; a plurality of connection wirings electrically connecting the first connection terminals and the second connection terminals; a chip selection terminal between the internal plane of the substrate portion and the upper surface of the electrical interconnect portion; and a chip selection wiring connected to the chip selection terminal and one of the second connection terminals and the first connection terminals; wherein at least one of the chip selection wiring and the plurality of connection wirings comprises a tilted portion with respect to the back side of the substrate portion.

In some embodiments, the tilted portion is in the substrate portion, and the chip selection wiring further comprises a vertical portion in the electrical interconnect portion.

In some embodiments, the chip selection wiring comprises a tilted portion with respect to the back side of the substrate portion, and at least one of the plurality of connection wirings comprises a vertical portion with respect to the back side of the substrate portion.

In some embodiments, at least one of the plurality of connection wirings comprises a tilted portion with respect to the back side of the substrate portion, and the chip selection wiring comprises a vertical portion in the substrate portion and a lateral portion connected to the vertical portion.

In some embodiments, at least one of the plurality of connection wirings comprises a tilted portion having a first tilt angle with respect to the back side of the substrate portion, and the chip selection wiring comprises a tilted portion having a second tilt angle with respect to the back side of the substrate portion, and the first tilt angle is different from the second tilt angle.

In some embodiments, at least one of the plurality of connection wirings comprises a tilted portion having a first tilt angle with respect to the back side of the substrate portion, and the chip selection wiring comprises a tilted portion having a second tilt angle with respect to the back side of the substrate portion, and the first tilt angle is substantially the same as the second tilt angle.

In some embodiments, the at least one of the connection wirings includes a vertical portion in the electrical interconnect portion.

In some embodiments, one of the connection wirings electrically connects one of the second connection terminals to one of the first connection terminals not vertically above the one of the second connection terminals.

In some embodiments, the chip selection terminal is disposed in the electrical interconnect portion.

In some embodiments, the chip selection terminal is disposed in the substrate portion.

In some embodiments, the plurality of first connection terminals is fewer than the plurality of the second connection terminals by at least one terminal.

In some embodiments, the at least one integrated circuit die is one of a plurality of integrated circuit dies on a wafer.

In some embodiments, the at least one integrated circuit die is an integrated circuit die separated from a wafer.

In some embodiments, the at least one integrated circuit die is a memory chip.

In some embodiments, the second connection terminals and the first connection terminals are positioned in a staggered manner along a vertical direction.

In some embodiments, the second connection terminals and the first connection terminals are positioned in a misaligned manner along a vertical direction.

In some embodiments, the chip package comprises a lower integrated circuit die and an upper integrated circuit die stacked over the lower integrated circuit die, wherein one of the plurality of second connection terminals of the upper integrated circuit die is not electrically connected to the plurality of first connection terminals of the lower integrated circuit die.

In some embodiments, the chip package comprises an adhesive layer interposed between the lower integrated circuit die and the upper integrated circuit die.

In some embodiments, the chip package comprises an object, and the at least one integrated circuit die being attached to the object, wherein the object is selected from the group consisting of a package circuit substrate, a silicon interposer, a glass interposer and another integrated circuit die.

Another aspect of the present disclosure provides a method for preparing a chip package. In some embodiments, the method comprises steps of providing a substrate portion having an internal plane between a front side and a back side; forming a chip selection terminal between the internal plane of the substrate portion and an upper surface of the electrical interconnect portion; forming an electrical interconnect portion on the front side; forming a plurality of first connection terminals on the upper surface of the electrical interconnect portion; forming a chip selection plug connected to the chip selection terminal; forming a plurality of connection plugs electrically connected to the first connection terminals; and forming a plurality of second connection terminals on the back side of the substrate portion and electrically connected to the plurality of connection plugs; wherein at least one of the chip selection plug and the plurality of connection plugs is a tilted plug with respect to the back side of the substrate portion.

In some embodiments, the method further comprises the steps of forming a mask layer having at least one opening on the back side of the substrate portion; tilting the substrate portion with respect to a horizontal plane; performing an etching process to remove a portion of the substrate portion through the at least one opening to form a hole with respect to the back side of the substrate portion; and filling the hole with a conductor.

In some embodiments, the method further comprises the steps of tilting the substrate portion with respect to a horizontal plane; performing a laser drilling process to remove a portion of the substrate portion from the back side of the substrate portion to form a hole with respect to the back side of the substrate portion; and filling the hole with a conductor.

In some embodiments, the forming of a chip selection wiring comprises performing a first etching process when the substrate portion is positioned at a first angle to form a first hole, the forming of a plurality of connection wirings comprises performing a second etching process when the substrate portion is positioned at a second angle to form a plurality of second holes, and the first hole and the second holes have different included angles with respect to the back side of the substrate portion.

In some embodiments, the forming of a chip selection wiring comprises performing a first laser drilling process when the substrate portion is positioned at a first angle to form a first hole, the forming of a plurality of connection wirings comprises performing a second laser drilling process when the substrate portion is positioned at a second angle to form a plurality of second holes, and the first hole and the second holes have different included angles with respect to the back side of the substrate portion.

In some embodiments, the method further comprises a step of stacking the at least one integrated circuit die to an object, the object is selected from the group consisting of a package circuit substrate, a silicon interposer, a glass interposer and another integrated circuit die.

In some embodiments of the present disclosure, in the integrated circuit die, at least one of the chip selection wiring and the plurality of connection wirings includes a tilted portion (tilted through silicon via) with respect to the back side of the substrate portion, so as to shorten the signal transmitting path for the chip selection signal in the integrated circuit die.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a chip package including at least one integrated circuit die having a tilted through silicon via. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
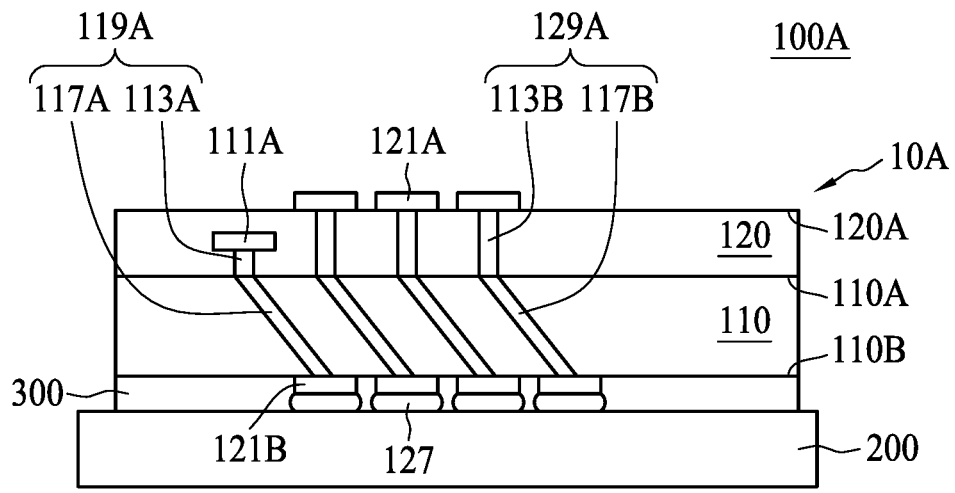
FIG. 1 is a cross-sectional view of a chip package in accordance with some embodiments of the present disclosure.

FIG. 1 is a cross-sectional view of a chip package 100A in accordance with some embodiments of the present disclosure. In some embodiments, the chip package 100A comprises an object 200 and at least one integrated circuit die 10A stacked to the object 200 by using an adhesive layer 300. In some embodiments, the at least one integrated circuit die 10A comprises a substrate portion 110 having a front side 110A and a back side 110B; an electrical interconnect portion 120 on the front side 110A; a plurality of upper connection terminals 121A on an upper surface 120A of the electrical interconnect portion 120; a plurality of lower connection terminals 121B on the back side 110B of the substrate portion 110; a chip selection terminal 111A in the electrical interconnect portion 120; and a chip selection wiring 119A connected to the chip selection terminal 111A and one of the lower connection terminals 121B, wherein the chip selection wiring 119A comprises a tilted chip selection plug 117A with respect to the back side 110B of the substrate portion 110. In some embodiments, the front side 110A includes, but not limited to, the upper surface of the substrate portion 110 facing the electrical interconnect portion 120 and the space above the upper surface; similarly, the back side 110B includes, but not limited to, the lower surface of the substrate portion 110 facing the object 200 and the space below the lower surface. In some embodiments, the chip selection terminal 111A is electrically connected to a gate terminal of a MOS transistor in a logic circuit such as the peripheral circuit of a DRAM chip, and the MOS transistor is configured to control whether allowing the propagation of the command instructions from a source terminal to a drain terminal thereof.

In some embodiments, the object 200 is a package circuit substrate or silicon/glass interposer, and the plurality of lower connection terminals 121B of the at least one integrated circuit die 10A is attached respectively to the object 200 via a plurality of metal bump 127. In some embodiments, the adhesive layer 300 is an anisotropic conductive film (ACF), an anisotropic conductive adhesive (ACA), nonconductive film/paste (NCF/NCP), underfill, MUF (molding underfill), and so on. The ACF or the ACA comprises an insulation film or an insulating adhesive, and conductive particles dispersed within the insulation film or the insulating adhesive. The NCF/NCP or underfill/MUF comprises an insulation film or adhesive, and non-conductive particles dispersed within insulation film/adhesive.

In some embodiments, the substrate portion 110 may include a silicon wafer. For example, the substrate portion 110 may include a single crystalline silicon wafer, a silicon bulk wafer including a silicon carbide (SiC) layer or silicon germanium (SiGe) layer, or a silicon-on-insulator (SOI) wafer including an insulating layer. In the present embodiments, it is assumed that the substrate portion 110 is a single crystalline silicon bulk wafer. In some embodiments, the at least one integrated circuit die 10A may include unit devices, which may be formed in the substrate portion 110 and/or on the substrate portion 110, and the unit device(s) may include metal-oxide-semiconductor (MOS) transistors.

In some embodiments, the at least one integrated circuit die 10A is one of a plurality of integrated circuit dies on a wafer. In some embodiments, the at least one integrated circuit die 10A is an integrated circuit die separated from a wafer. In some embodiments, the at least one integrated circuit die 10A is a memory chip such as DRAM chips or flash memory chips. It is well known that a memory chip comprises address input terminals for addressing memory cells, data input/output terminals for inputting/outputting data to/from the memory cells, and power supply terminals.

In some embodiments, the tilted chip selection plug 117A is inside the substrate portion 110, and the chip selection wiring 119A further comprises a vertical plug 113A in the electrical interconnect portion 120. In some embodiments, the chip selection terminal 111A is formed on the front side 110A of the substrate portion 110, and there is no vertical plug below the chip selection terminal 111A. In some embodiments, the chip package 10A further comprises a plurality of connection wirings 129A electrically connecting the upper connection terminals 121A and the lower connection terminals 121B, wherein at least one of the connection wirings 129A includes a tilted connection plug 117B in the substrate portion 110. In some embodiments, the connection wirings 129A further comprises a vertical portion 113B in the electrical interconnect portion 120. In some embodiments, the tilted angle of the tilted chip selection plug 117A with respect to the back side 110B of the substrate portion 110 is substantially the same as that of the tilted connection plug 117B with respect to the back side 110B of the substrate portion 110.

In some embodiments, one of the connection wirings 129A electrically connects one of the lower connection terminals 121B to one of the upper connection terminals 121A not vertically above the one of the lower connection terminals 121B. In some embodiments, the lower connection terminals 121B and the upper connection terminals 121A are positioned in a staggered manner along a vertical direction. In some embodiments, the lower connection terminals 121B and the upper connection terminals 121A are positioned in a misaligned manner along a vertical direction. In some embodiments, the plurality of upper connection terminals 121A is fewer than the plurality of the lower connection terminals 121B by at least one terminal.

Figure 2:
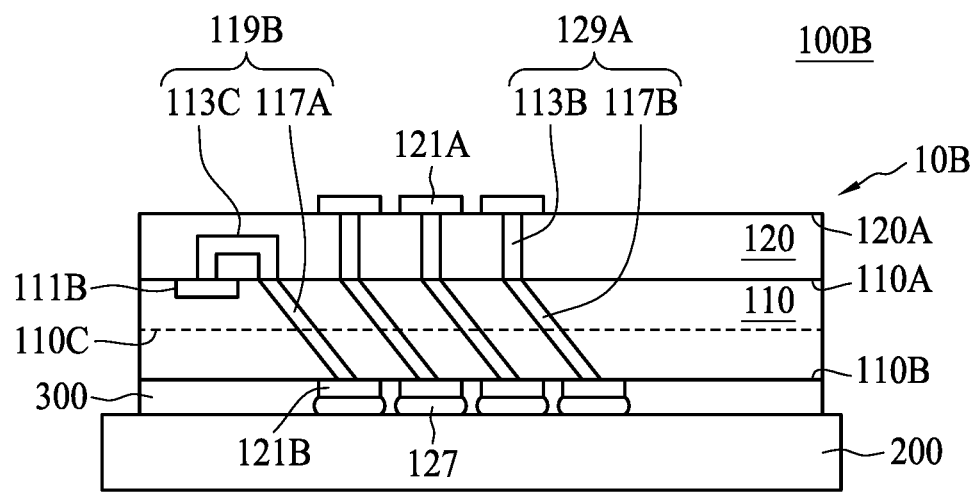
FIG. 2 is a cross-sectional view of a chip package in accordance with some embodiments of the present disclosure.

FIG. 2 is a cross-sectional view of a chip package 100B in accordance with some embodiments of the present disclosure. In some embodiments, the chip package 100B comprises an object 200 and at least one integrated circuit die 10B stacked to the object 200 by using an adhesive layer 300. In some embodiments, the substrate portion 110 has an internal plane 110C between the front side 110A and the back side 110B. Compared to the integrated circuit die 10A in FIG. 1 having the chip selection terminal 111A in the electrical interconnect portion 120, the chip package 100B in FIG. 2 has a chip selection terminal 111B in the substrate portion 110, i.e., between the internal plane 110C of the substrate portion 110 and the upper surface 120A of the electrical interconnect portion 120. In some embodiments, the internal plane 110C is a bottom plane of an isolation structure such as a shallow trench isolation (STI).

In some embodiments, the substrate portion 110 has a depression (not shown in the drawings) below the front side 110A, and the chip selection terminal 111B is formed in the depression. In some embodiments, the integrated circuit die 10B comprises a chip selection wiring 119B connected to the chip selection terminal 111B and one of the lower connection terminals 121B. In some embodiments, the chip selection wiring 119B comprises a tilted chip selection plug 117A in the substrate portion 110 and an interconnect 113C in the electrical interconnect portion 120, wherein the tilted chip selection plug 117A is tilted with respect to the back side 110B of the substrate portion 110. In some embodiments, the tilted angle of the tilted chip selection plug 117A with respect to the back side 110B of the substrate portion 110 is substantially the same as that of the tilted connection plug 117B with respect to the back side 110B of the substrate portion 110.

Figure 3:
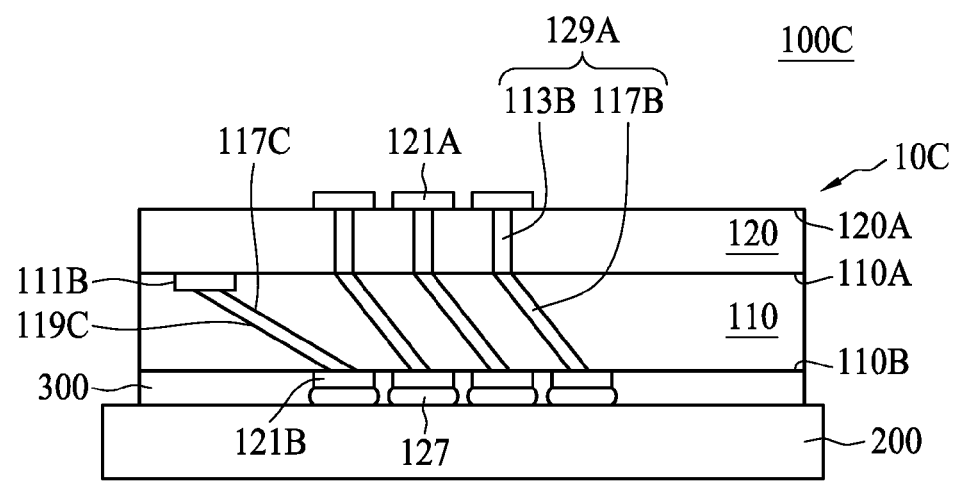
FIG. 3 is a cross-sectional view of a chip package in accordance with some embodiments of the present disclosure.

FIG. 3 is a cross-sectional view of a chip package 100C in accordance with some embodiments of the present disclosure. In some embodiments, the chip package 100C comprises an object 200 and at least one integrated circuit die 10C stacked to the object 200 by using an adhesive layer 300. In FIG. 2, to connect the chip selection terminal 111B and one of the lower connection terminals 121B, the integrated circuit die 10B uses the chip selection wiring 119B including a tilted chip selection plug 117A in the substrate portion 110 and an interconnect 113C in the electrical interconnect portion 120. In contrast, in FIG. 3, to connect the chip selection terminal 111B and one of the lower connection terminals 121B, the integrated circuit die 10C uses a tilted chip selection plug 119C as a chip selection wiring 119C in the substrate portion 110. In some embodiments, the tilted angle of the tilted chip selection plug 117B with respect to the back side 110B of the substrate portion 110 is different from that of the tilted connection plug 117B with respect to the back side 110B of the substrate portion 110.

Figure 4:
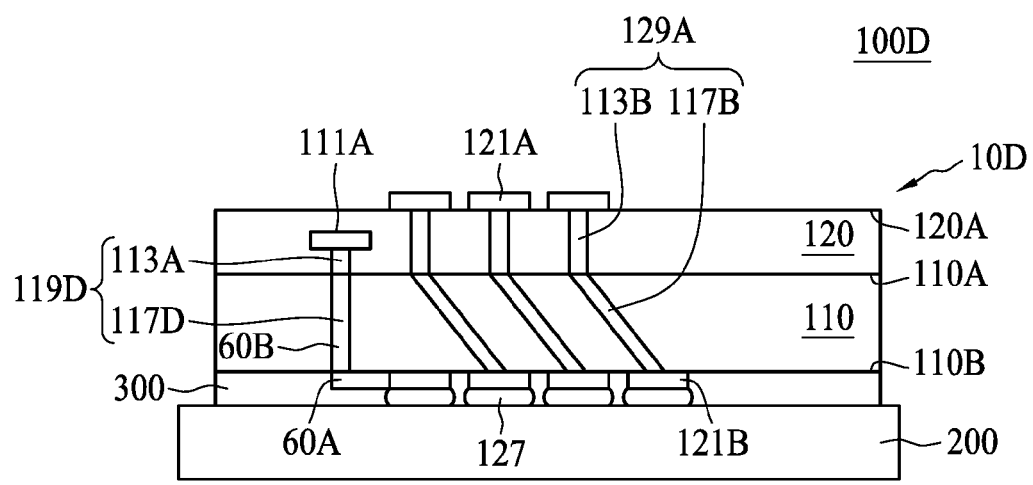
FIG. 4 is a cross-sectional view of a chip package in accordance with some embodiments of the present disclosure.

FIG. 4 is a cross-sectional view of a chip package 100D in accordance with some embodiments of the present disclosure. In some embodiments, the chip package 100D comprises an object 200 and at least one integrated circuit die 10D stacked to the object 200 by using an adhesive layer 300. In FIG. 1, to connect the chip selection terminal 111A and one of the lower connection terminals 121B, the integrated circuit die 10A uses the chip selection wiring 119A including a tilted chip selection plug 117A in the substrate portion 110 and a vertical plug 113A in the electrical interconnect portion 120. In contrast, in FIG. 4, to connect the chip selection terminal 111A and one of the lower connection terminals 121B, the integrated circuit die 10D uses a chip selection wiring 119D including an interconnect 117D in the substrate portion 110 and the vertical plug 113A in the electrical interconnect portion 120. In some embodiments, the chip selection terminal 111A is formed on the upper surface of the substrate portion 110, and the interconnect 117D directly contacts the bottom of the chip selection terminal 111A without using the vertical plug 113A.

In some embodiments, the interconnect 117D includes a lateral portion 60A connected to the lower connection terminals 121B and a vertical portion 60B connected to the bottom of the chip selection terminal 111A and the lateral portion 60A. In some embodiments, the lateral portion 60A is implemented in a redistribution layer (RDL) on the back side 110B of the substrate portion 110, and the vertical portion 60B is implemented in the substrate portion 110. In other words, in the integrated circuit die 10D, a non-tilting wiring is used to connect the chip selection terminal 111A and one of the lower connection terminals 121B, while tilting wirings are used to connect the upper connection terminals 121A and the lower connection terminals 121B.

Figure 5:
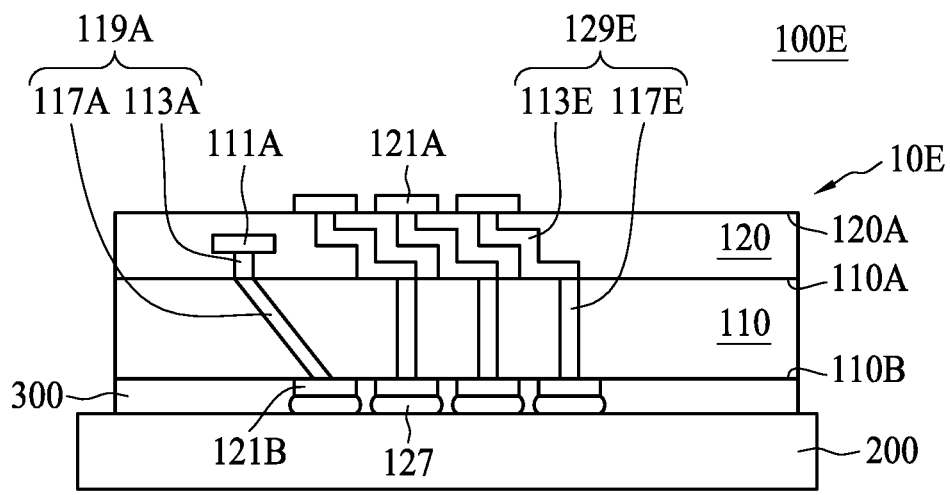
FIG. 5 is a cross-sectional view of a chip package in accordance with some embodiments of the present disclosure.

FIG. 5 is a cross-sectional view of a chip package 100E in accordance with some embodiments of the present disclosure. In some embodiments, the chip package 100E comprises an object 200 and at least one integrated circuit die 10E stacked to the object 200 by using an adhesive layer 300. In FIG. 1, to connect the upper connection terminals 121A and the lower connection terminals 121B, the integrated circuit die 10A uses the connection wirings 129A including a tilted connection plug 117B in the substrate portion 110 and a vertical portion 113B in the electrical interconnect portion 120. In contrast, in FIG. 5, to connect the upper connection terminals 121A and the lower connection terminals 121B, the integrated circuit die 10E uses a plurality of connecting wirings 129E each including an interconnect 113E the electrical interconnect portion 120 and a vertical via 117E in the substrate portion 110. In other words, in the integrated circuit die 10E, non-tilting wirings are used to connect the upper connection terminals 121A and the lower connection terminals 121B, while a tilting wiring is used to connect the chip selection terminal 111A and one of the lower connection terminals 121B.

Figure 6:
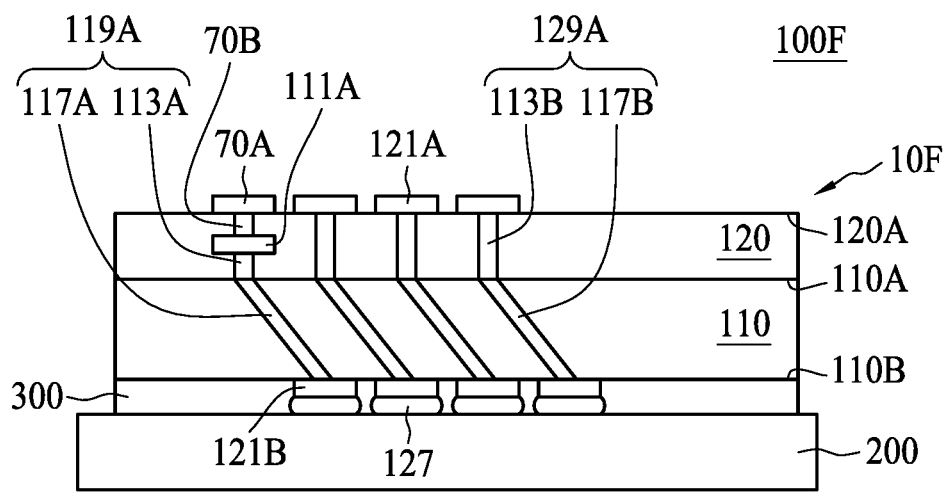
FIG. 6 is a cross-sectional view of a chip package in accordance with some embodiments of the present disclosure.

FIG. 6 is a cross-sectional view of a chip package 100F in accordance with some embodiments of the present disclosure. In some embodiments, the chip package 100F comprises an object 200 and at least one integrated circuit die 10F stacked to the object 200 by using an adhesive layer 300. In FIG. 1, the number of the upper connection terminals 121A is fewer than the number of the lower connection terminals 121B by at least one terminal. In contrast, in FIG. 6, the number of the upper connection terminals 121A is the same as the number of the lower connection terminals 121B. In some embodiments, the integrated circuit die 10F further includes an upper connection terminal 70A above the chip selection terminal 111A and a vertical plug 70B connecting the chip selection terminal 111A and the upper connection terminal 70A. In some embodiments, the upper connection terminal 70A is integrally formed with the upper connection terminals 121A; consequently, the number of the upper connection terminals 121A is the same as the number of the lower connection terminals 121B.

Figure 7:
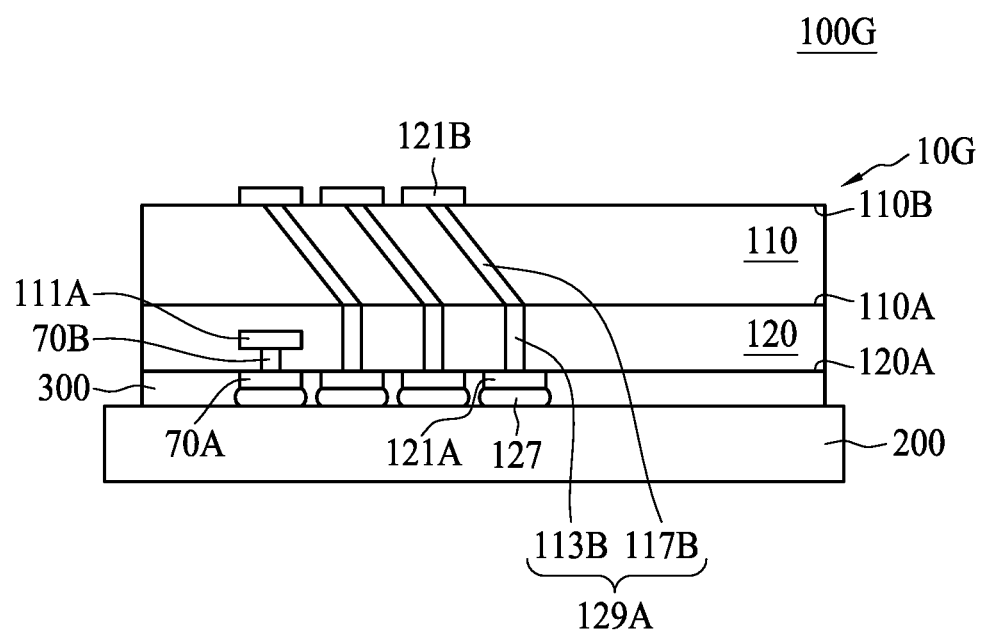
FIG. 7 is a cross-sectional view of a chip package in accordance with some embodiments of the present disclosure.

FIG. 7 is a cross-sectional view of a chip package 100G in accordance with some embodiments of the present disclosure. In some embodiments, the chip package 100G comprises an object 200 and at least one integrated circuit die 10G stacked to the object 200 by using an adhesive layer 300. In FIG. 1, the integrated circuit die 10 is stacked to the object 200 in a face-up manner, while the integrated circuit die 10G in FIG. 7 is stacked to the object 200 in a face-down manner.

In FIG. 7, in some embodiments, the integrated circuit die 10G further includes an upper connection terminal 70A and a vertical plug 70B connecting the chip selection terminal 111A and the upper connection terminal 70A; in addition, the chip selection terminal 111A is not connected to the lower connection terminals 121B. Consequently, the number of the connection terminals on the upper surface 120A is more than the number of the connection terminals on the back side 110B. In some embodiments, the vertical plug 70B in the electrical interconnect portion 120 is used as the chip selection plug (wiring), and there is no chip selection plug 113A in the substrate portion 110. In some embodiments, the integrated circuit die 10G may have the chip selection terminal in the substrate portion 110, as shown in FIG. 2.

Figure 8:
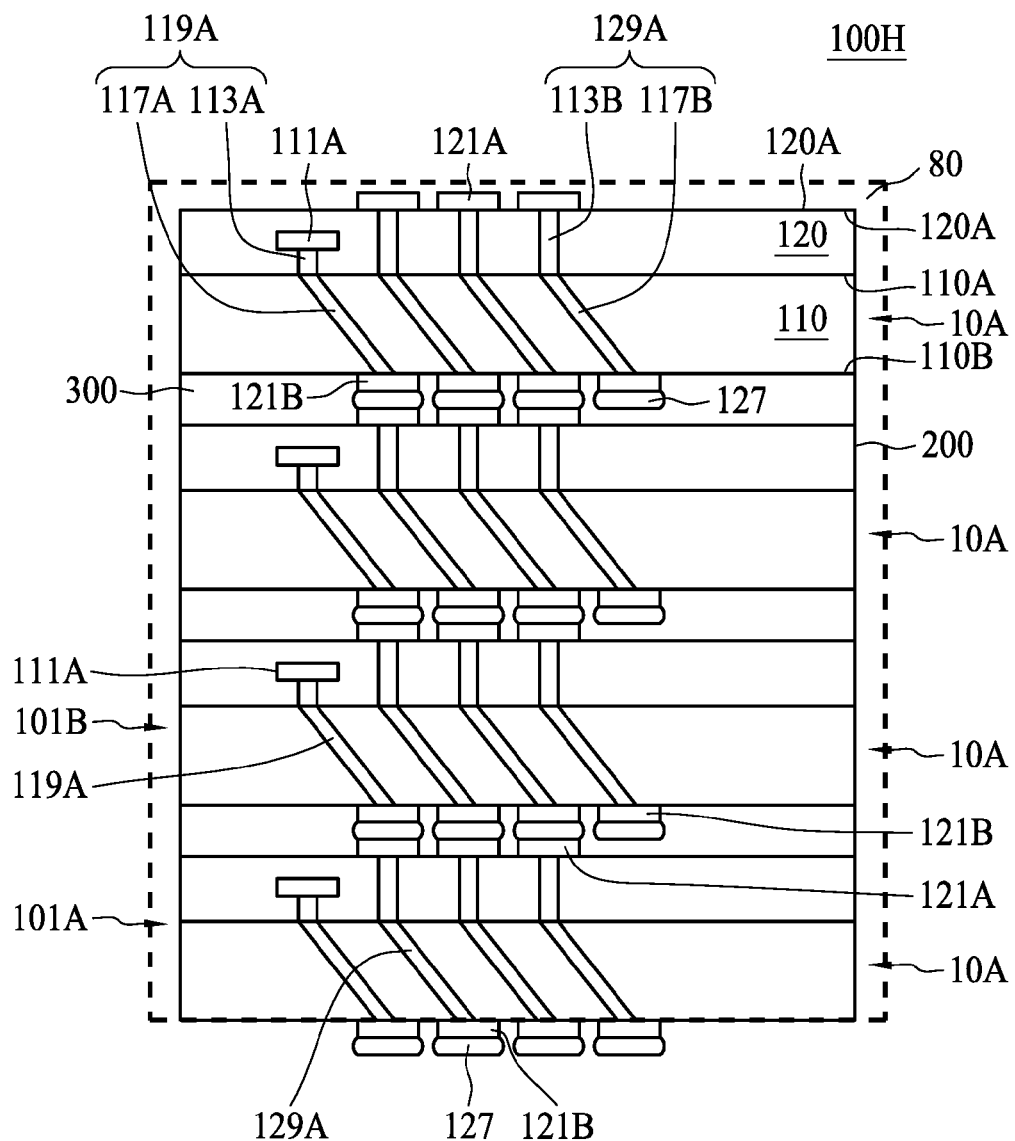
FIG. 8 is a cross-sectional view of a chip package in accordance with some embodiments of the present disclosure.

FIG. 8 is a cross-sectional view of a chip package 100H in accordance with some embodiments of the present disclosure. Electronic equipment using semiconductor devices are essential for many modern applications. With the advancement of electronic technology, electronic equipment is becoming increasingly smaller in size and complicated in structure and functionality. Wafer level packaging (WLP) technology has been gaining popularity and is widely applied. This technology provides a wafer level manufacturing of semiconductor devices with high functions and complicated structures while the size of the semiconductor devices is minimized.

In some embodiments, the chip package 100H comprises a plurality of stacked integrated circuit die 10A shown in FIG. 1. In some embodiments, the chip package 100H further comprises a molding compound 80 encapsulating the plurality of stacked integrated dies 10A. In some embodiments, the molding compound 80 includes various materials, for example, one or more of epoxy resins, phenolic hardeners, silicas, catalysts, pigments, mold release agents, and the like. In addition to stacking the same integrated circuit dies 10A in FIG. 1 to form the chip package 100H, the chip package 100H may be formed by stacking different integrated circuit dies shown in FIGS. 1-6.

In some embodiments, considering the bottommost integrated circuit die 10A to be a first integrated circuit die 101A and the integrated circuit die 10A right on the bottommost integrated circuit die to be a second integrated circuit die 101B, one of the plurality of lower connection terminals 121B (the rightmost one) of the second integrated circuit die 101B is not electrically connected to the plurality of upper connection terminals 121A of the first integrated circuit die 101A.

In some embodiments, for example, as an electronic signal is selectively transmitted to the chip selection terminal 111A of the second integrated circuit die 101B via the lower connection terminals 121B of the first integrated circuit die 101A, the connection wiring 129A of the first integrated circuit die 101A and the chip selection wiring 119A of the second integrated circuit die 101B, the second integrated circuit die 101B is selected for operation and can be accessed, while other non-select integrated circuit dies cannot be accessed. Similarly, the other integrated circuit dies 10A can be selected for operation and can be accessed by selectively applying electronic signals to different lower connection terminals 121B of the first integrated circuit die 101A.

Figure 9:
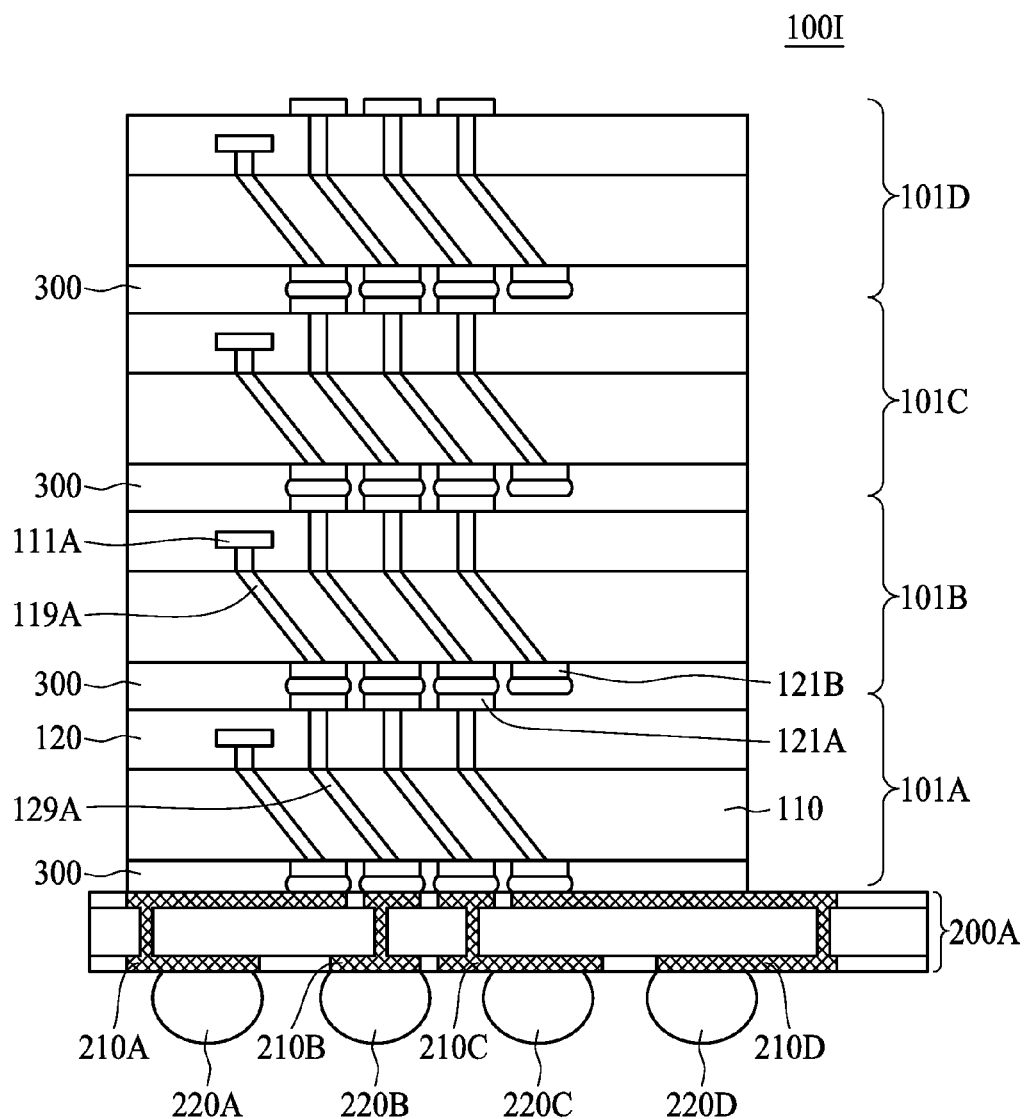
FIG. 9 is a cross-sectional view of a chip package in accordance with some embodiments of the present disclosure.

FIG. 9 is a cross-sectional view of a chip package 100I in accordance with some embodiments of the present disclosure. In some embodiments, the chip package 100I comprises a plurality of stacked integrated circuit die 10A shown in FIG. 1 on an object 200A. In some embodiments, the chip package 100I comprises a first integrated circuit die 101A attached to the object 200A, a second integrated circuit die 101B attached to the first integrated circuit die 101A from the front side 110A, a third integrated circuit die 101C attached to the second integrated circuit die 101B from the front side 110A, and a fourth integrated circuit die 101D attached to the third integrated circuit die 101C from the front side 110A, with an adhesive layer 300 interposed between the integrated circuit dies. In addition to stacking the same integrated circuit dies 10A in FIG. 1 to form the chip package 100I, the chip package 100I may be formed by stacking different integrated circuit dies shown in FIGS. 1-6.

In some embodiments, the object 200A is a package circuit substrate having a plurality of contacts 210A, 210B, 210C and 210D, in which each has an upper pad, a bottom pad, and a conduction path electrically connecting the bottom pad to the upper pad. In addition, the package circuit substrate or silicon/glass interposer also has a plurality of solder balls or bumps (like copper pillar bump) 220A, 220B, 220C and 220D respectively attached to the plurality of bottom pads of the plurality of contacts 210A, 210B, 210C and 210D. In some embodiments, the plurality of lower connection terminals 121B of the at least one integrated circuit die 10A is attached respectively to the plurality of upper pads of the package circuit substrate 200 via the metal bump 127.

In some embodiments, for example, as electronic signals are selectively transmitted to the chip selection terminal 111A of the second integrated circuit die 101B via the solder ball 220B, the contact 210B, the connection wiring 129A of the first integrated circuit die 101A and the chip selection wiring 119A of the second integrated circuit die 101B, the second integrated circuit die 101B is selected for operation and can be accessed, while other non-select integrated circuit dies cannot be accessed. Similarly, the first integrated circuit die 101A can be selected for operation and can be accessed by selectively transmitting electronic signals via the solder ball 220A, the third integrated circuit die 101C can be selected for operation and can be accessed by selectively transmitting electronic signals via the solder ball 220C, and the fourth integrated circuit die 101D can be selected for operation and can be accessed by selectively transmitting electronic signals via the solder ball 220D.

Figure 10:
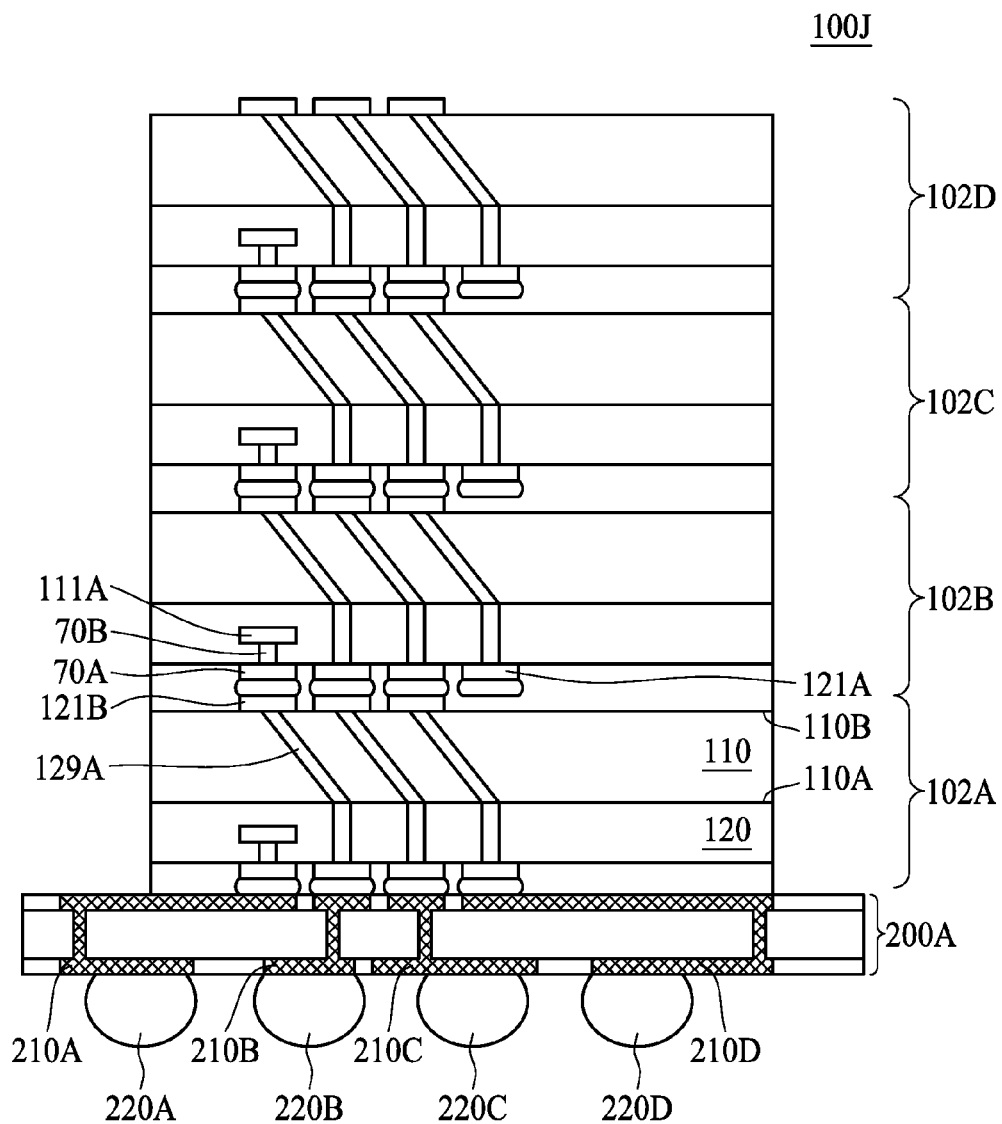
FIG. 10 is a cross-sectional view of a chip package in accordance with some embodiments of the present disclosure.

FIG. 10 is a cross-sectional view of a chip package 100J in accordance with some embodiments of the present disclosure. In some embodiments, the chip package 100J comprises a plurality of stacked integrated circuit die 10G shown in FIG. 7 on an object 200A. In some embodiments, the chip package 100I comprises a first integrated circuit die 102A attached to the object 200A, a second integrated circuit die 102B attached to the first integrated circuit die 102A from the back side 110B, a third integrated circuit die 102C attached to the second integrated circuit die 102B from the back side 110B, and a fourth integrated circuit die 102D attached to the third integrated circuit die 102C from the back side 110B, with an adhesive layer 300 interposed between the integrated circuit dies.

In some embodiments, for example, as electronic signals are selectively transmitted to the chip selection terminal 111A of the second integrated circuit die 102B via the solder ball 220B, the contact 210B, the connection wiring 129A of the first integrated circuit die 102A and the vertical plug 70B of the second integrated circuit die 102B, the second integrated circuit die 102B is selected for operation and can be accessed, while other non-select integrated circuit dies cannot be accessed. Similarly, the first integrated circuit die 102A can be selected for operation and can be accessed by selectively transmitting electronic signals via the solder ball 220A, the third integrated circuit die 102C can be selected for operation and can be accessed by selectively transmitting electronic signals via the solder ball 220C, and the fourth integrated circuit die 102D can be selected for operation and can be accessed by selectively transmitting electronic signals via the solder ball 220D.

Figure 11:
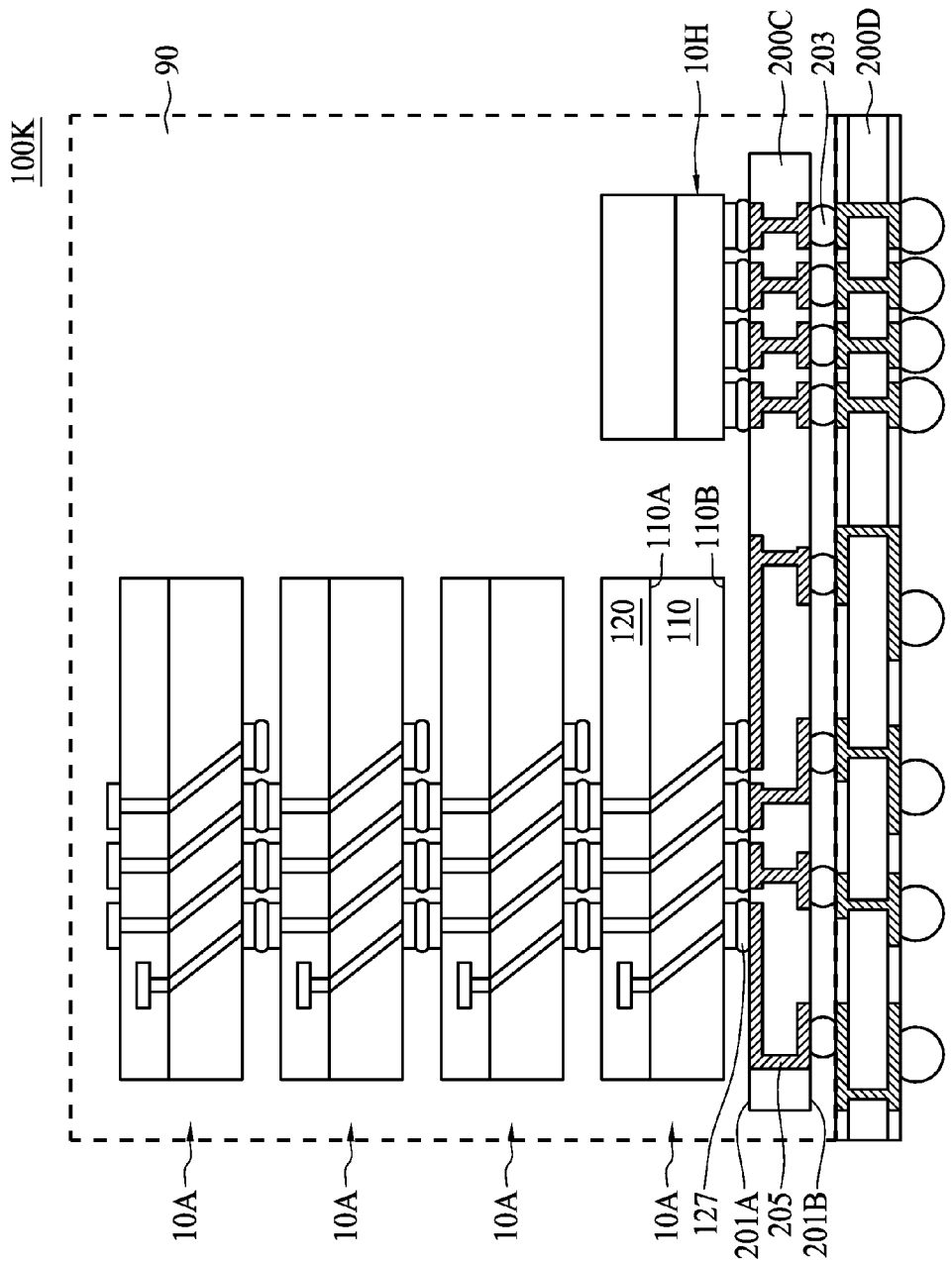
FIG. 11 is a cross-sectional view of a chip package in accordance with some embodiments of the present disclosure.

FIG. 11 is a cross-sectional view of a chip package 100K in accordance with some embodiments of the present disclosure. In some embodiments, the chip package 100K comprises a plurality of stacked integrated circuit die 10A shown in FIG. 1 on a first portion of an object 200C and an integrated circuit die 10H on a second portion of the object 200C, wherein the integrated circuit die 10H has different functions from the integrated circuit die 10A. In some embodiments, the chip package 100K further comprises an object 200D, the object 200C is attached to the object 200D.

In some embodiments, the object 200C is a glass interposer or a silicon interposer, and the object 200D is a package circuit substrate. In some embodiments, the integrated circuit die 10A and the integrated circuit die 10H are attached to the interposer 200C from a first side 201A with the metal bumps 127, the package circuit substrate is attached to the interposer 200C from a second side 201B with solder balls 203, wherein the interposer 200C comprises internal wirings 205 electrically connecting the metal bumps 127 on the first side 201A to the solder balls 203 on the second side 201B. In some embodiments, the first side 201A includes, but not limited to, the upper surface of the interposer 200C facing the integrated circuit die 10A and the space above the upper surface; similarly, the second side 201B includes, but not limited to, the lower surface of the interposer 200C facing the object 200D and the space below the lower surface.

In some embodiments, the chip package 100K further comprises a molding compound 90 encapsulating the dies and the object 200C. In some embodiments, the molding compound 90 includes various materials, for example, one or more of epoxy resins, phenolic hardeners, silicas, catalysts, pigments, mold release agents, and the like. In addition to stacking the same integrated circuit dies 10A in FIG. 1 in the chip package 100K, the chip package 100K may be formed by stacking different integrated circuit dies shown in FIGS. 1-6; furthermore, the chip package 100K may be formed by stacking different integrated circuit dies shown in FIG. 7.

FIGS. 12-17 are cross-sectional views showing the fabrication for preparing an integrated circuit die 10A in accordance with some embodiments of the present disclosure.

Figure 12:
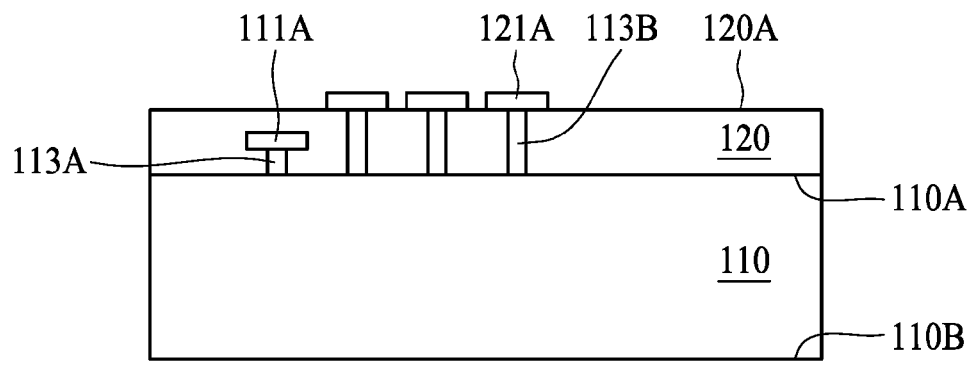
FIGS. 12-17 are cross-sectional views showing the fabrication for preparing an integrated circuit die in accordance with some embodiments of the present disclosure.

Referring to FIG. 12, an electrical interconnect portion 120 is formed on a substrate portion 110 by fabrication processes including deposition, lithographic and etching processes. In some embodiments, the substrate portion 110 may include a transistor in an active area (AA) surrounded by an isolation structure such as a shallow trench isolation (STI). In some embodiments, the electrical interconnect portion 120 is formed on the substrate portion 110 by back-end-of-line (BEOL) metallization technology.

In some embodiments, the substrate portion 110 has a front side 110A and a back side 110B, and a chip selection terminal 111A is formed on the front side 110A, and a plurality of upper connection terminals 121A are formed on an upper surface 120A of the electrical interconnect portion 120 by fabrication processes including deposition, lithographic and etching processes. In some embodiments, the electrical interconnect portion 120 has a vertical plug 113A below the chip selection terminal 111A and a plurality of vertical plugs 113B below the upper connection terminals 121A respectively.

Figure 13:
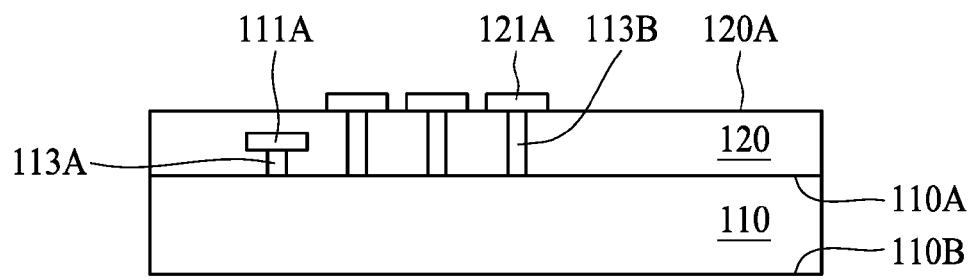

Referring to FIG. 13, in some embodiments, the substrate portion 110 is thinned by performing a grinding process on the back side 110B of the substrate portion 110.

Figure 14:
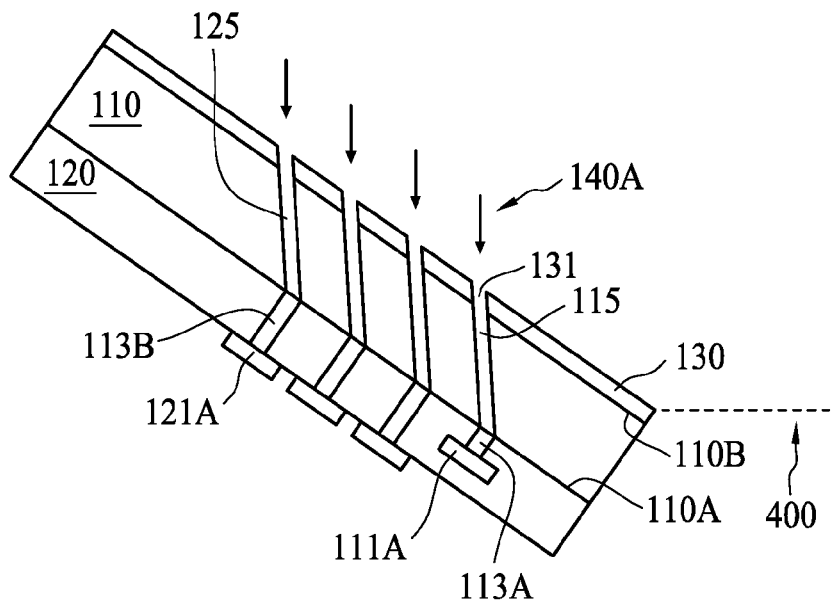

Referring to FIG. 14, a mask layer 130, such as a photoresist layer having at least one opening 131, is formed on the back side of the substrate portion, and the substrate portion 110 is tilted with respect to a horizontal plane 400. Subsequently, an etching process, such as an anisotropic dry etching by using an etching gas 140A, is performed to remove a portion of the substrate portion 110 through the at least one opening 131 to form a first hole 115 exposing the vertical plug 113A, wherein an included angle between the first hole 115 and the back side 110B of the substrate portion 110 is not a right angle. In some embodiments, the etching process also forms a plurality of second holes 125 exposing the plurality of vertical plugs 113B respectively, wherein an included angle between the second hole 125 and the back side 110B of the substrate portion 110 is not a right angle.

Figure 15:
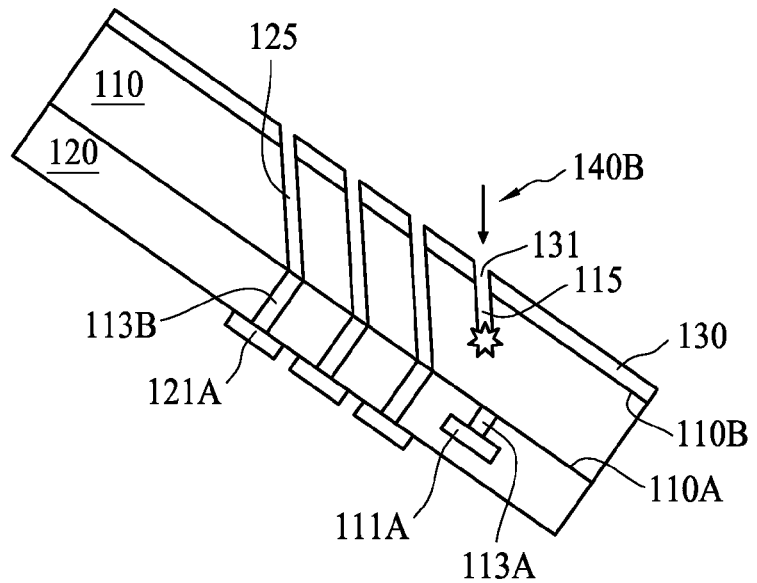

Referring to FIG. 15, in some embodiments, instead of using anisotropic dry etching, a laser 140B can be used to form the first hole 115 and the second holes 125 exposing the plurality of vertical plugs 113B. Details of the laser drilling process are available in the art: (http://www.oxfordlasers.com/laser-micromachining/laser-micro-drilling/?gclid=COO7woD3g8MCFVcDvAod2K8ATw), the entirety of which is herein incorporated by reference and will not be repeated. In some embodiments, the first hole 115 exposes the vertical plug 113A (or the bottom of the chip selection terminal 111A if the chip selection terminal 111A is formed in the substrate portion 110).

Figure 16:
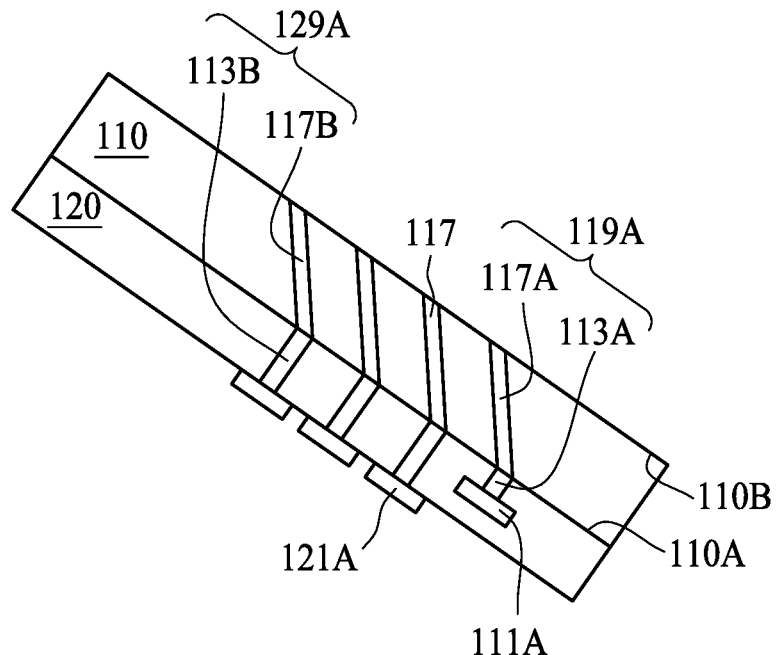

Referring to FIG. 16, in some embodiments, the mask layer 130 is removed, and the first hole 115 is filled with a conductor 117 to form a tilted chip selection plug 117A, and the tilted chip selection plug 117A and the vertical plug 113A form a chip selection wiring 119. In some embodiments, the second holes 125 are filled with the conductor 117 to form a plurality of tilted connection plugs 117B, and the tilted connection plugs 117B and the vertical plugs 113B form connection wirings 129A. In some embodiments, tungsten (W) is used as the conductor 117, but other conductive materials may also be used. A conventional plating technique, such as bottom-up plating mechanism for high aspect ratio trench, is used in filling the first hole 115 and the second holes 125. In some embodiments, the tilted plug 117A and the tilted plugs 117B serve as tilted through silicon vias.

Figure 17:
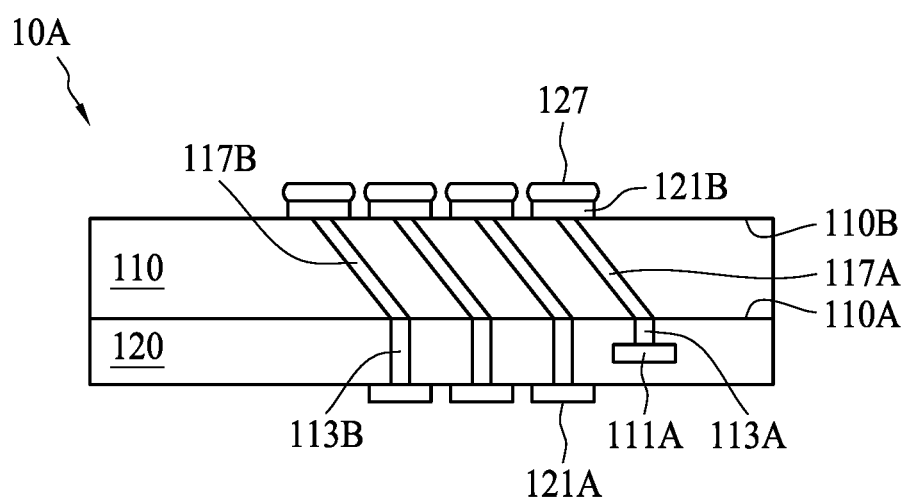

Referring to FIG. 17, a plurality of lower connection terminals 121B are formed on the back side 110B of the substrate portion 110, wherein one of the lower connection terminals 121B is connected to the tilted plug 117A of the chip selection wiring 119. In some embodiments, the other lower connection terminals 121B are connected to the tilted plug 117B of the connection wirings 129A. Subsequently, metal bumps 127 are formed on the lower connection terminals 121B so as to complete the integrated circuit die 10A.

Subsequently, the integrated circuit die 10A is attached to an object 200 with an adhesive layer 300 interposed between the integrated circuit die 10A and the object 200 to form the chip package 10, as shown in FIG. 1.

In the embodiments shown in FIGS. 14-17, the first hole 115 and the second hole 125 are formed by the same fabrication process. In some embodiments, the first hole 115 and the second hole 125 are formed by different fabrication processes. For example, the substrate portion 110 may be positioned at a first angle to perform a first etching (laser drilling) process to form a first hole exposing the vertical plug 113A, and then the substrate portion 110 is then positioned at a second angle to perform a second etching (laser drilling process) to form a plurality of second holes exposing the plurality of vertical plugs 113B. In some embodiments, the first angle and the second angle are the included angle between the back side 110B and a vertical line, and the first hole and the second holes have different included angles with respect to the back side 110B of the substrate portion 110. In some embodiments, one of the first angle and the second angle is substantially a right angle.

In addition, those skilled in the art should understand that the fabrication processes disclosed in FIGS. 12-17 can be readily utilized as a basis for modifying or designing to prepare the die structure shown in FIGS. 2-7.

One aspect of the present disclosure provides a chip package comprising at least one integrated circuit die. In some embodiments, the integrated circuit die includes a substrate portion having an internal plane between a front side and a back side, an electrical interconnect portion on the front side, a plurality of first connection terminals on an upper surface of the electrical interconnect portion, a plurality of second connection terminals on the back side of the substrate portion, a plurality of connection wirings electrically connecting the first connection terminals and the second connection terminals, a chip selection terminal between the internal plane of the substrate portion and the upper surface of the electrical interconnect portion, and a chip selection wiring connected to the chip selection terminal and one of the second connection terminals and the first connection terminal.

Another aspect of the present disclosure provides a method for preparing a chip package. In some embodiments, the method comprises steps of providing a substrate portion having an internal plane between a front side and a back side; forming a chip selection terminal between the internal plane of the substrate portion and an upper surface of the electrical interconnect portion; forming an electrical interconnect portion on the front side; forming a plurality of first connection terminals on the upper surface of the electrical interconnect portion; forming a chip selection wiring connected to the chip selection terminal; forming a plurality of connection wirings electrically connected to the first connection terminals; and forming a plurality of second connection terminals on the back side of the substrate portion and electrically connected to the plurality of connection wirings; wherein at least one of the chip selection wiring and the plurality of connection wirings comprises a tilted plug with respect to the back side of the substrate portion.

In some embodiments of the present disclosure, in the integrated circuit die, at least one of the chip selection wiring and the plurality of connection wirings includes a tilted plug (tilted through silicon via) with respect to the back side of the substrate portion, so as to shorten the signal transmitting path for the chip selection signal in the integrated circuit die.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A chip package comprising at least one integrated circuit die, the at least one integrated circuit die comprising:
    a substrate portion having an internal plane between a front side and a back side;
    an electrical interconnect portion contacting the front side of the substrate portion;
    a plurality of first connection terminals on an upper surface of the electrical interconnect portion;
    a plurality of second connection terminals on the back side of the substrate portion;
    a plurality of connection wirings electrically connecting the first connection terminals and the second connection terminals;
    a chip selection terminal between the internal plane of the substrate portion and the upper surface of the electrical interconnect portion; and
    a chip selection wiring connected to the chip selection terminal and one of the second connection terminals and the first connection terminals;
    wherein at least one of the chip selection wiring and the plurality of connection wirings comprises a tilted portion with respect to the back side of the substrate portion.

2. The chip package of claim 1, wherein the tilted portion is in the substrate portion, and the chip selection wiring further comprises a vertical portion in the electrical interconnect portion.

3. The chip package of claim 1, wherein the chip selection wiring comprises a tilted portion with respect to the back side of the substrate portion, and at least one of the plurality of connection wirings comprises a vertical portion with respect to the back side of the substrate portion.

4. The chip package of claim 1, wherein at least one of the plurality of connection wirings comprises a tilted portion with respect to the back side of the substrate portion, and the chip selection wiring comprises a vertical portion in the substrate portion and a lateral portion connected to the vertical portion.

5. The chip package of claim 1, wherein at least one of the plurality of connection wirings comprises a tilted portion having a first tilt angle with respect to the back side of the substrate portion, and the chip selection wiring comprises a tilted portion having a second tilt angle with respect to the back side of the substrate portion, and the first tilt angle is different from the second tilt angle.

6. The chip package of claim 1, wherein at least one of the plurality of connection wirings comprises a tilted portion having a first tilt angle with respect to the back side of the substrate portion, and the chip selection wiring comprises a tilted portion having a second tilt angle with respect to the back side of the substrate portion, and the first tilt angle is substantially the same as the second tilt angle.

7. The chip package of claim 1, wherein the at least one of the connection wirings includes a vertical portion in the electrical interconnect portion.

8. The chip package of claim 1, wherein one of the connection wirings electrically connects one of the second connection terminals to one of the first connection terminals not vertically above the one of the second connection terminals.

9. The chip package of claim 1, wherein the chip selection terminal is disposed in the electrical interconnect portion.

10. The chip package of claim 1, wherein the chip selection terminal is disposed in the substrate portion.

11. The chip package of claim 1, wherein the plurality of first connection terminals is fewer than the plurality of the second connection terminals by at least one terminal.

12. The chip package of claim 1, wherein the at least one integrated circuit die is one of a plurality of integrated circuit dies on a wafer.

13. The chip package of claim 1, wherein the at least one integrated circuit die is an integrated circuit die separated from a wafer.

14. The chip package of claim 1, wherein the at least one integrated circuit die is a memory chip.

15. The chip package of claim 1, wherein the at least one integrated circuit die includes a lower integrated circuit die and an upper integrated circuit die stacked over the lower integrated circuit die, and the upper integrated circuit die includes the plurality of second connection terminals and the lower integrated circuit die includes the plurality of first connection terminals, wherein one of the plurality of second connection terminals of the upper integrated circuit die is not electrically connected to the plurality of first connection terminals of the lower integrated circuit die.

16. The chip package of claim 15, further comprising an adhesive layer interposed between the lower integrated circuit die and the upper integrated circuit die.

17. The chip package of claim 1, further comprising an object, and the at least one integrated circuit die being attached to the object, wherein the object is selected from the group consisting of a package circuit substrate, a silicon interposer, a glass interposer and another integrated circuit die.

18. A method for preparing a chip package, comprising a step of forming at least one integrated circuit die, and the forming of the at least one integrated circuit die comprising:
   providing a substrate portion having an internal plane between a front side and a back side;
   forming a chip selection terminal on the internal plane of the substrate portion;
   forming an electrical interconnect portion contacting on the front side of the substrate portion;
   forming a plurality of first connection terminals on an upper surface of the electrical interconnect portion;
   forming a chip selection plug connected to the chip selection terminal;
   forming a plurality of connection plugs electrically connected to the first connection terminals; and
   forming a plurality of second connection terminals on the back side of the substrate portion and electrically connected to the plurality of connection plugs;
   wherein at least one of the chip selection plug and the plurality of connection plugs is a tilted plug with respect to the back side of the substrate portion.

* * * * *